(12) United States Patent
Shen et al.

(10) Patent No.: US 10,419,005 B2
(45) Date of Patent: Sep. 17, 2019

(54) PHASE-LOCKED-LOOP ARCHITECTURE

(71) Applicant: Taiwan Semiconductor Manufacturing Co., Ltd., Hsin-Chu (TW)

(72) Inventors: Ruey-Bin Shen, Taichung (TW); Tsung-Hsien Tsai, Zhongli (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/710,506

(22) Filed: Sep. 20, 2017

(65) Prior Publication Data

US 2018/0167073 A1 Jun. 14, 2018

Related U.S. Application Data

(60) Provisional application No. 62/433,914, filed on Dec. 14, 2016.

(51) Int. Cl.
| | |
|---|---|
| *H03L 7/07* | (2006.01) |
| *H03L 7/08* | (2006.01) |
| *H03L 7/099* | (2006.01) |
| *H03L 7/089* | (2006.01) |
| *H03L 7/083* | (2006.01) |
| *H03L 7/22* | (2006.01) |

(52) U.S. Cl.
CPC .......... *H03L 7/07* (2013.01); *H03L 7/08* (2013.01); *H03L 7/0802* (2013.01); *H03L 7/083* (2013.01); *H03L 7/089* (2013.01); *H03L 7/0891* (2013.01); *H03L 7/099* (2013.01); *H03L 7/22* (2013.01); *H03L 7/0995* (2013.01)

(58) Field of Classification Search
CPC ......... H03L 7/07; H03L 7/0891; H03L 7/099; H03L 7/0802; H03L 7/0995
See application file for complete search history.

(56) References Cited

U.S. PATENT DOCUMENTS

| | | | | |
|---|---|---|---|---|
| 4,868,522 | A * | 9/1989 | Popat | G06F 1/10 327/231 |
| 5,565,816 | A * | 10/1996 | Coteus | G06F 1/10 327/147 |
| 6,111,712 | A * | 8/2000 | Vishakhadatta | G11B 19/247 360/51 |
| 6,593,792 | B2 * | 7/2003 | Fujii | G06F 1/10 327/276 |
| 6,813,721 | B1 * | 11/2004 | Tetreault | G06F 1/10 713/400 |
| 7,038,552 | B2 * | 5/2006 | Brett | H03B 5/04 331/117 FE |

(Continued)

*Primary Examiner* — Kenneth B Wells
(74) *Attorney, Agent, or Firm* — Duane Morris LLP

(57) ABSTRACT

A phase-lock-loop (PLL) circuit includes a reference PLL circuit configured to generate a reference clock signal; a single clock tree circuit, coupled to the reference PLL circuit, and configured to distribute the reference clock signal; and a plurality of designated PLL circuits coupled to the clock tree circuit, wherein the designated PLL circuits are each configured to receive the distributed reference clock signal through the single clock tree circuit and provide a respective clock signal based on the reference clock signal.

19 Claims, 10 Drawing Sheets

(56) References Cited

U.S. PATENT DOCUMENTS

| | | | |
|---|---|---|---|
| 7,265,634 B2* | 9/2007 | Miki | H03L 3/00 |
| | | | 327/159 |
| 7,602,254 B2* | 10/2009 | Sandner | H03L 7/23 |
| | | | 327/147 |
| 8,265,219 B1* | 9/2012 | Hronik | G01R 31/31718 |
| | | | 375/354 |
| 9,172,383 B2* | 10/2015 | Chang | G06F 1/10 |
| 9,310,831 B2* | 4/2016 | Sunder | G06F 1/10 |
| 9,419,589 B2* | 8/2016 | Kumar | G06F 1/10 |
| 9,582,028 B1* | 2/2017 | Xiu | G06F 1/12 |
| 2004/0145397 A1* | 7/2004 | Lutkemeyer | G06F 1/10 |
| | | | 327/158 |

* cited by examiner

PHASE-LOCKED-LOOP ARCHITECTURE

CROSS-REFERENCE TO RELATED APPLICATION

The present application claims priority to U.S. Provisional Patent Application No. 62/433,914, filed on Dec. 14, 2016, which is incorporated by reference herein in its entirety.

BACKGROUND

Phase-locked-loop ("PLL") circuits have been extensively used as a clock distributer in analog electrical systems and communication systems. Some key advantages that a PLL circuit brings to clock distribution are phase/delay compensation, frequency multiplication and duty cycle correction. A PLL circuit enables a periodic signal or a clock signal to be phase-aligned with frequency multiples of a reference clock signal. As the name (i.e., phase locked) implies, an output of the PLL circuit locks onto the incoming reference clock signal and generates a periodic output signal with a frequency equal to the average frequency of the reference clock signal. When the PLL output signal (i.e., the output of the PLL circuit) tracks the reference clock signal such that a difference between a phase of the PLL output signal and a phase of the reference clock signal is constant over time, the PLL circuit is said to be "locked."

In today's high performance systems operating within increasingly stringent timing constraints, PLL circuits have also been used in digital electronic circuits and/or mixed-signal (i.e., analog and digital) circuits. For example, a PLL circuit that serves as a clock signal distributer of a system-on-chip (SoC) circuit is typically fabricated with the SoC circuit on a single chip. In general, the SoC circuit includes a plurality of sub-system circuits such as, for example, a central processing unit (CPU) circuit, a universal serial bus (USB) circuit, a graphics processing unit (GPU) circuit, a serial AT attachment (SATA) circuit, etc. Each of the sub-system circuits may require a respective clock signal (i.e., a respective frequency) for operations. As such, the PLL circuit of modern SoC circuits typically includes plural sub-PLL circuits, each of which is configured to provide a particular clock signal with a respective frequency to a corresponding sub-system circuit through at least one respective clock tree circuit.

Various issues may arise because of using such an architecture for provisions of plural clock signals. For example, the requirement of plural clock tree circuits may in turn consume additional power and disadvantageously induce undesired noise (e.g., jitter noise). Further, under concern of being interfered by power supply noise, the plural sub-PLL circuits typically use respectively dedicated power supply signals (i.e., instead of using global power supply signals of the SoC circuit), and such sub-PLL circuits can only be deployed away from the sub-system circuits (even away from each sub-PLL circuit's corresponding sub-system circuit). This may accordingly increase complexity in designing a floor plan to lay out the SoC circuit. Thus, existing PLL circuits are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a phase-locked-loop (PLL) architecture of a system-on-chip (SoC) circuit that can provide plural clock signals to respective sub-system circuits of the SoC circuit while using one single clock tree circuit. As such, the above-mentioned issues induced by the requirement of plural clock tree circuits in conventional PLL circuits may be advantageously avoided. Further, in some embodiments, the PLL architecture includes plural designated PLL circuits, wherein each designated PLL circuit includes one or more protection circuits to enhance respective power supply rejection rate (PSRR). As such, the designated PLL circuit may share a global power supply signal with other circuits of the SoC circuit and be deployed at a desired location on a chip where the SoC is made while being immune to power supply noise. Still further, in some embodiments, each designated PLL circuit includes a realignment circuit that helps eliminate, at least part of, accumulated jitter noise across respective PLL circuit components, which advantageously decrease output noise and thus decrease overall power consumption of the disclosed PLL architecture.

Figure 1:
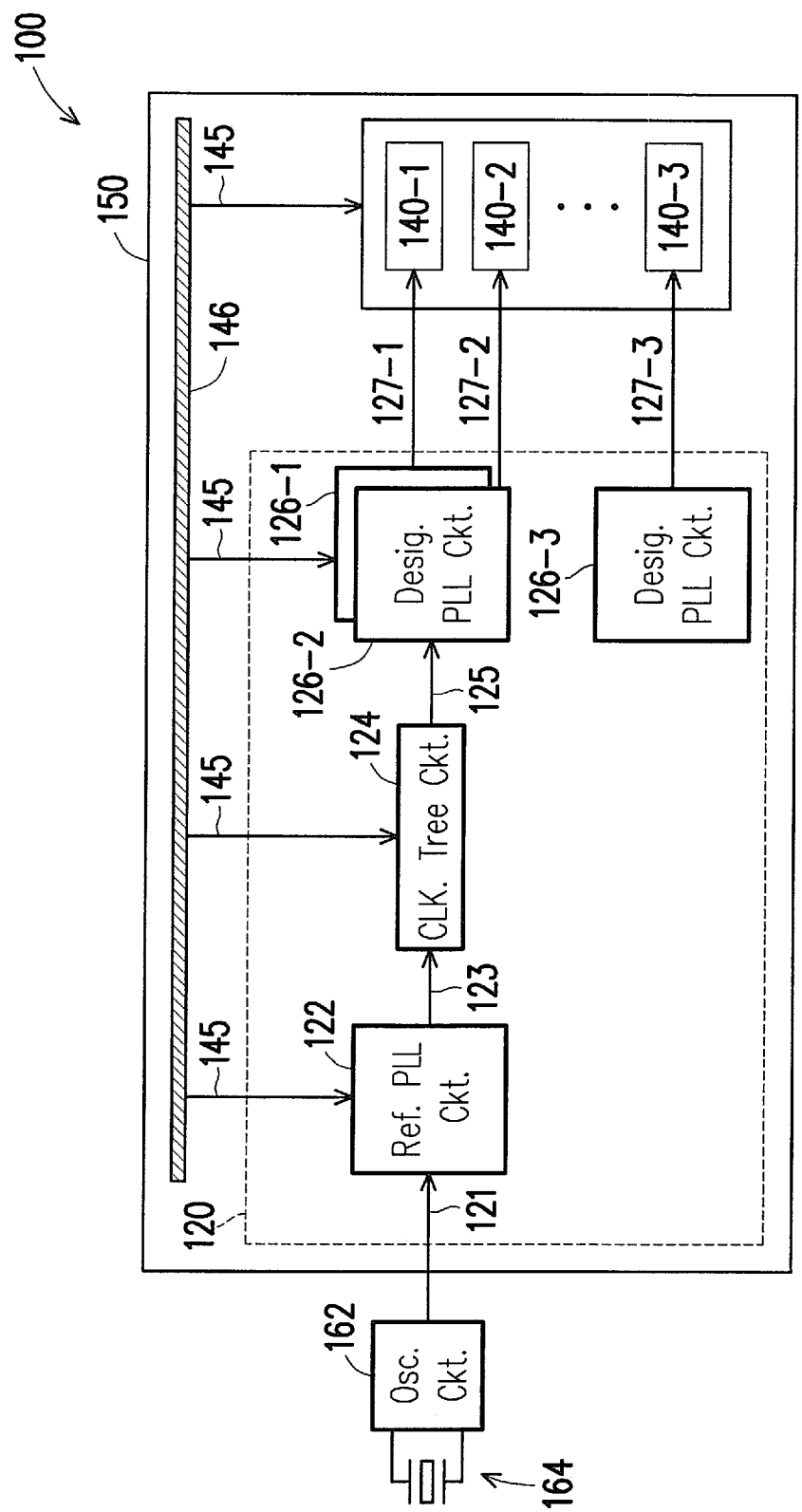
FIG. 1 illustrates an exemplary block diagram of a system-on-chip (SoC) circuit including a phase-locked-loop (PLL) architecture, in accordance with some embodiments.

FIG. 1 illustrates an exemplary block diagram of a circuit 100 including a PLL architecture 120, in accordance with some embodiments. The circuit 100 also includes one or more sub-system circuits 140-1, 140-2, and 140-3, and a global power supply bus 146. Each sub-system circuit may include at least one of the following circuits: a central processing unit (CPU) circuit, a universal serial bus (USB) circuit, a graphics processing unit (GPU) circuit, a serial AT attachment (SATA) circuit, a peripheral component interconnect express (PCIe) circuit, a memory circuit, or the like. Although only three sub-system circuits 140-1, 140-2, and 140-3 are shown in FIG. 1, it is understood that any desired number of sub-system circuits may be included in the circuit 100 while remaining within the scope of the present disclosure. In some embodiments, the PLL architecture 120 and the sub-system circuits (140-1, 140-2, 140-3, etc.) are formed on a single chip (e.g., a semiconductor substrate) 150 such that the circuit 100, including the PLL architecture 120 and the sub-system circuits (140-1, 140-2, 140-3, etc.), may be hereinafter referred to as a "system-on-chip (SoC)" circuit 100.

In some embodiments, the PLL architecture 120 includes a reference PLL circuit 122, a clock tree circuit 124, and plural designated PLL circuits (126-1, 126-2, and 126-3). Each of the plural designated PLL circuits (126-1, 126-2, and 126-3) is configured to be coupled to at least a corresponding sub-system circuit (140-1, 140-2, and 140-3). For example, as shown, the designated PLL circuit 126-1 is coupled to the sub-system circuit 140-1; the designated PLL circuit 126-2 is coupled to the sub-system circuit 140-2; and the designated PLL circuit 126-3 is coupled to the sub-system circuit 140-3.

Although only three designated PLL circuits (126-1, 126-2, and 126-3) are shown, it is understood that the number of the designated PLL circuits corresponds to the number of the sub-system circuits (140-1, 140-2, and 140-3) that require a clock signal in the illustrated embodiment of FIG. 1. Thus, while the number of the sub-system circuits changes in some other embodiments, the number of designated PLL circuits may also change accordingly.

In some embodiments, all the components of the PLL architecture 120 (e.g., the reference PLL circuit 122, the clock tree circuit 124, and the designated PLL circuits 126-1 to 126-3) and the sub-system circuits (140-1, 140-2, and 140-3) are configured to receive a power supply signal (e.g., a supplied voltage) from the global power bus 146. Alternatively stated, a supplied voltage, hereinafter referred as "$V_{DDG}$ (145)," may be globally used by each of the components/circuits, mentioned above, in the SoC circuit 100 through the global power bus 146.

As mentioned above, a PLL circuit is configured to "lock" a PLL output signal (i.e., a clock signal) with a reference clock signal. According to some embodiments of the present disclosure, the reference PLL circuit 122 is configured to receive an external clock signal 121 from an oscillation circuit 162 coupled to the SoC circuit 100 externally. Such an oscillation circuit 162 is coupled to an external crystal 164. By using the external clock signal 121, the reference PLL circuit provides a reference clock signal 123 (with a reference frequency ($f_{ref}$)) to the clock tree circuit 124. The clock tree circuit 124 is configured to propagate/distribute the reference clock signal 123 as a distributed clock signal 125 with minimum noise and skew to the plural designated. PLL circuits (126-1, 126-2, and 126-3). Once the plural designated PLL circuits (126-1, 126-2, and 126-3) receive the distributed clock signal 125, each of the plural designated PLL circuits (126-1, 126-2, and 126-3) may accordingly use the distributed clock signal 125 to provide a respective clock signal with a particular frequency to the corresponding sub-system circuits).

For example, the designated PLL circuit 126-1 is configured to provide a clock signal 127-1 with a first locked frequency ($f_1$) to the sub-system circuit 140-1; the designated PLL circuit 126-2 is configured to provide a clock signal 127-2 with a second locked frequency ($f_2$) to the sub-system circuit 140-2; and the designated circuit 126-3 is configured to provide a clock signal 127-3 with a third locked frequency ($f_3$) to the sub-system circuit 140-3. Details of the reference PLL circuit 122, the clock tree circuit 124, the designated PLL circuit (126-1, 126-2, 126-3, etc.) will be discussed further below with respect to FIGS. 2A-2C, 3, and 4, respectively.

Figure 2A:
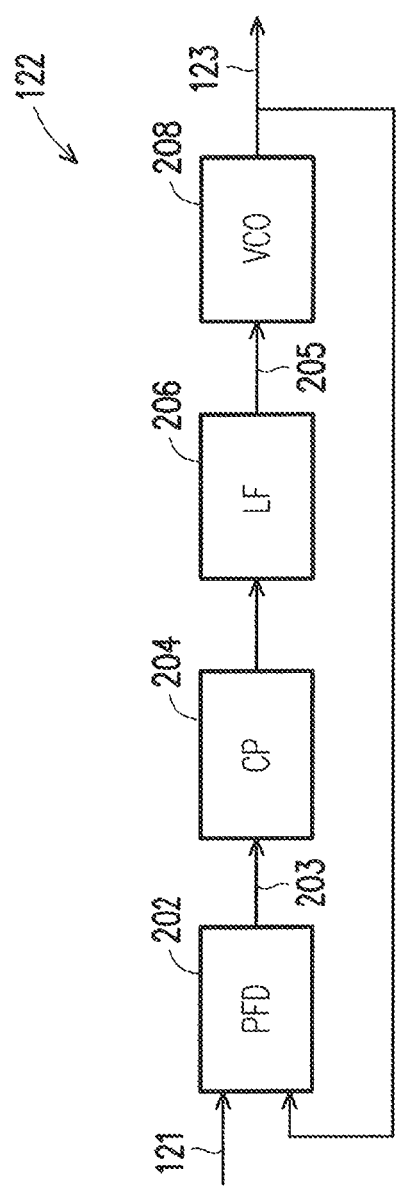
FIG. 2A illustrates an exemplary block diagram of a reference PLL circuit of the PLL architecture of FIG. 1, in accordance with some embodiments.

FIG. 2A illustrates an exemplary block diagram of the reference PLL circuit 122, in accordance with some embodiments. The reference PLL circuit 122 includes a phase frequency detector (PFD) 202, a charge pump (CP) 204, a low-pass filter (LF) 206, and a voltage control oscillator (VCO) 208. It is noted that the illustrated embodiment of FIG. 2A is merely an example for facilitating a better understanding of various concepts of the present disclosure. In some other embodiments, the reference circuit 122 may include any of various other circuit components (e.g., a voltage divider, a mixer, a counter, etc.) while remaining within the scope of the present disclosure.

In some embodiments, to be used in a phase-locked application so as to provide the locked reference clock signal 123, the PFD 202 is typically considered as a digital block that is configured to receive the external clock signal 121 in a digital format to output a digital control signals 203 to the serially coupled CP 204 and LF 206. More specifically, the digital control signal 203 may be generated in response to a reception of the reference clock signal 121 based on various parameters of the PFD 202 such as, for example, a reset time, a rising time, a falling time, a delay time, and the like of the PFD 202.

The CP 204 and LF 206, coupled between the PFD 202 and the VCO 208, then use the digital control signal 203 to output a voltage control signal 205 to the serially coupled VCO 208. More specifically, in some embodiments, the voltage control signal 205 may be generated in response to a reception of the digital control signal 203 based on various parameters such as, for example, an upper current level of the CP 204, a lower current level of the CP 204, a capacitance value of the LF 206, a resistance value of the LF 206, etc.

Figure 2B:
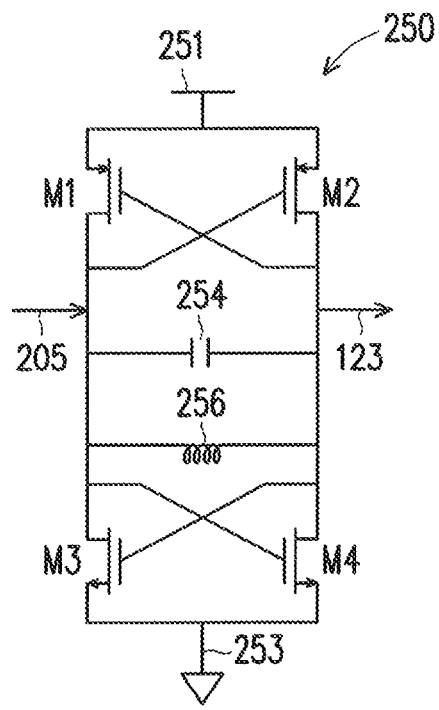
FIG. 2B illustrates an exemplary circuit diagram of a voltage control oscillator (VCO) of the reference PLL circuit of FIG. 2A, in accordance with some embodiments.
Figure 2C:
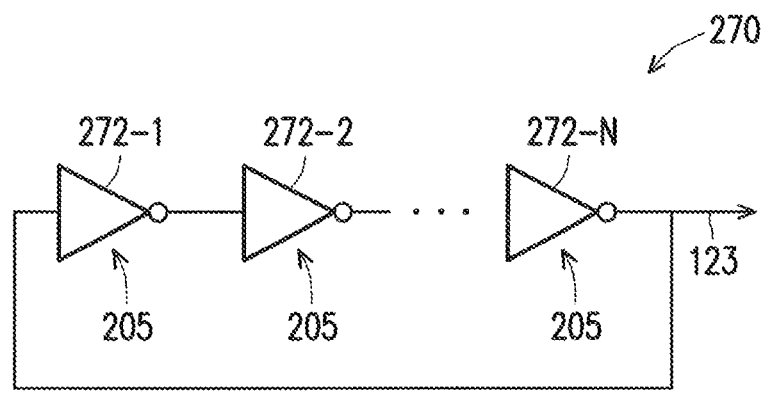
FIG. 2C illustrates another exemplary circuit diagram of the VCO of the reference PLL circuit of FIG. 2A, in accordance with some embodiments.

The VCO 208 then uses the control voltage signal 205 to output the reference clock signal 123. More specifically, in some embodiments, the reference clock signal 123 may be generated in response to a reception of the voltage control signal 205 based on various parameters, such as, for example, a voltage-to-frequency gain of the VCO 208, and the reference clock signal 123 may be fed back to the PHI) 202 as another input signal of the PFD 202. Two exemplary circuit diagrams of the VCO 208 are shown in FIGS. 2B and 2C, respectively. In FIG. 2B, the VCO 208 is implemented by an inductor-capacitor (LC) tank oscillator 250. In FIG. 2C, the VCO 208 is implemented by a ring oscillator 270. It is noted that the LC tank oscillator 250 and the ring oscillator 270, as shown in FIGS. 2B and 2C, respectively, are merely for illustration purposes, so that the respective circuitry will be briefly described as follows.

Referring to FIG. 2B, the LC tank oscillator 250 is configured to receive the control voltage signal 205 at an input end (left side in FIG. 2B) of the LC tank oscillator 250 and output the reference clock signal 123 as an oscillation signal at an output end (right side in FIG. 2B) of the LC tank oscillator 250. More particularly, the LC tank oscillator 250 may be coupled between a first voltage reference 251 (e.g., $V_{DDG}$ 145 of FIG. 1) and a second voltage reference 253 (e.g., ground), and include transistors M1, M2, M3, M4, a capacitor 254, and an inductor 256. The transistors M1 and M2 may be each implemented by a p-type metal-oxide-semiconductor (PMOS) transistor, and the transistors M3 and M4 may be each implemented by an n-type metal-oxide-semiconductor (NMOS) transistor. It is noted that the transistors M1 to M4 may be each implemented by any of various types of transistors (e.g., a bipolar junction transistor (BJT), a high-electron mobility transistor (HEMT), etc.) while remaining within the scope of the present disclosure. More specifically, in some embodiments, the transistors (M1 and M2) and (M3 and M4) may be cross-coupled between the input and output ends, and the capacitor 254 and the inductor 256 are each coupled between the input and output ends. In some embodiments, the frequency ($f_{ref}$) of the reference clock signal 123 may be inversely proportional to a square root of the capacitor 254's capacitance value "C" and the inductor 256's inductance value "L."

Referring to FIG. 2C, the ring oscillator 270 may include an odd number "N" of inverters (272-1, 272-2, 272-N, etc.) serially coupled to one another. More specifically, each inverter's output is coupled to an input of a next serially coupled inverter, and a last inverter's output (e.g., 272-N) is coupled to a first inverter's input (e.g., 272-1) so as to form a ring. In some embodiments, each inverter (272-1, 272-2, 272-N, etc.) may have a respective time delay $T_{delay}$, and may be controlled by the voltage control signal 205. When an oscillation occurs in the ring oscillator 270, in some embodiments, the frequency ($f_{ref}$) of the reference clock signal 123 may be inversely proportional to N times $T_{delay}$.

Figure 3:
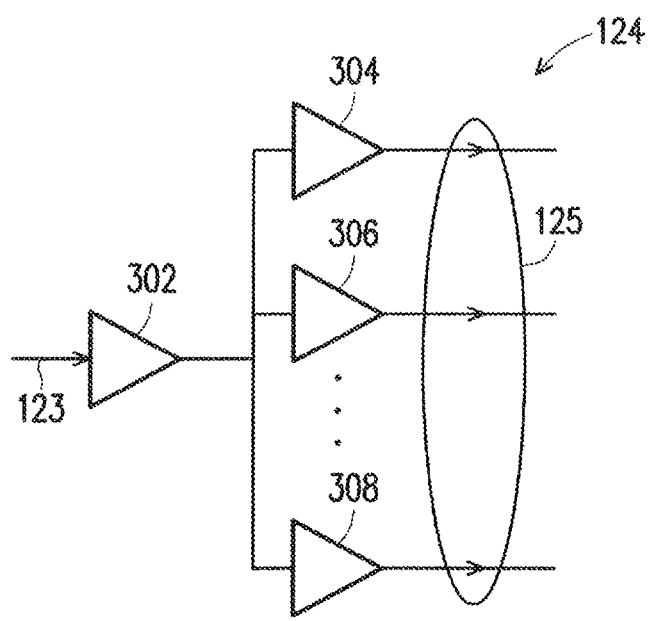
FIG. 3 illustrates an exemplary schematic diagram of a clock tree circuit of the PLL architecture of FIG. 1, in accordance with some embodiments.

FIG. 3 illustrates an exemplary schematic diagram of the clock tree circuit 124, in accordance with some embodiments. As mentioned above, the clock tree circuit 124 is configured to distribute the reference clock signal 123 as the distributed clock signal 125 to the plural designated PLL circuits (126-1, 126-2, 126-3, etc.). In some embodiments, since the distributed clock signal 125 is commonly shared by the plural designated PLL circuits (126-1, 126-2, 126-3, etc.), it may be understood by people of ordinary skill in the art that the clock tree circuit 124 may be implemented by one or more buffers (302, 304, 306 308, etc.) that are formed in a "tree" shape, as shown in the illustrated embodiment of FIG. 3. Referring again to FIG. 1, depending on a layout design of the reference PLL circuit 122 with respect to the plural designated PLL circuits (126-1, 126-2, 126-3, etc.), the one or more buffers (302, 304, 306 308, etc.) may be formed in any of a variety of clock distribution networks known in the art such as, for example, an X-Tree network, an H-Tree network, a Tapered H-Tree network, etc. Further, in some embodiments, since the distributed clock signal 125 includes a minimal amount of delay and skew, the distributed clock signal 125 may be substantially similar to the reference clock signal 123, i.e., sharing the same frequency $f_{ref}$.

Figure 4A:
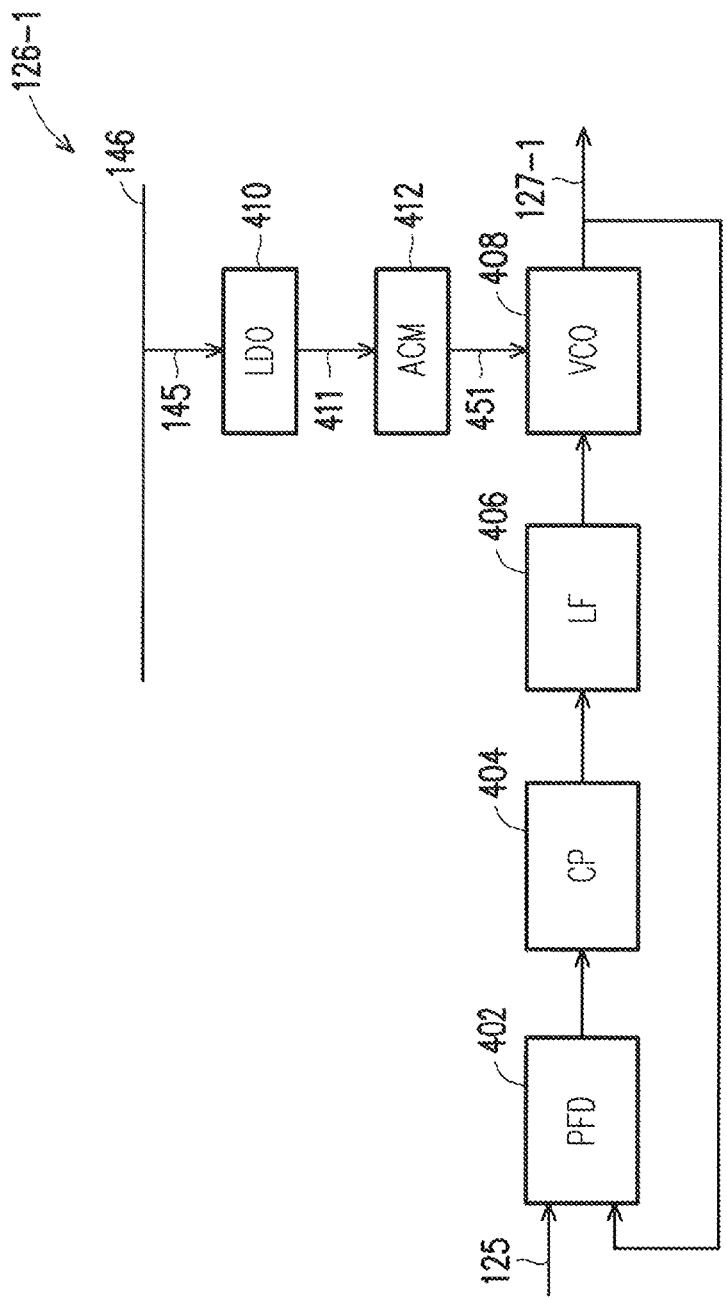
FIG. 4A illustrates an exemplary block diagram of a designated PLL circuit of the PLL architecture of FIG. 1, in accordance with some embodiments.

FIG. 4A illustrates an exemplary block diagram of one of the designated PLL circuits (126-1, 126-2, 126-3, etc.), in accordance with some embodiments. The designated PLL circuits (126-1, 126-2, 126-3, etc.) are substantially similar to one another. Thus, the following discussion of the designated PLL circuit will use the designated PLL circuit 126-1 as a representative example. As mentioned above, in some embodiments, the designated PLL circuit 126-1 includes one or more protection circuits, e.g., a low-dropout (LDO) regulator 410 and an active current mirror (ACM) 412, to enhance the power supply rejection rate (PSRR) of the designated PLL circuit 126-1. As such, the designated PLL circuit 126-1 can use the global supplied voltage $V_{DDG}$ that is also used by other circuits of the SoC circuit 100, e.g., 122, 124, and 140-1 to 140-3 (FIG. 1) while being able to be deployed at a desired location on the chip 150 and immune to power supply noise, if any.

In some embodiments, the designated PLL circuit 126-1 is substantially similar to the reference PLL circuit 122 of FIG. 2A except that the designated PLL circuit 126-1 includes the above-mentioned protection circuits: LDO regulator 410 and ACM 412. Thus, the following discussion of the designated PLL circuit 126-1 will be focused on the LDO regulator 410 and the ACM 412. The designated PLL circuit 126-1 includes a PFD 402, a CP 404, a LF 406, and a VCO 408 coupled to the global power bus 146 through the LDO regulator 410 and the ACM 412. The designated PLL circuit 126-1 is configured to receive the distributed clock signal 125, and use the respective functionality of each of the PFD 402, the CP 404, the LF 406, and the VCO 408 as discussed above to provide the clock signal 127-1 to the sub-system circuit 140-1 with the locked frequency f1 that is desired/specified by the sub-system circuit 140-1.

Instead of directly using the global supplied voltage $V_{DDG}$, in some embodiments, the VCO 408 of the designated PLL circuit 126-1 may use a "clean" supplied voltage 451. More specifically, the LDO regulator 410, coupled to the global power bus 146, is configured to regulate the global supplied voltage $V_{DDG}$ (145) to provide a regulated supplied voltage 411 by rejecting power supply noise, and the ACM 412 is further configured to provide a relatively stable supplied voltage 451 to operate the VCO 408. The LDO regulator 410 and the ACM 412 will be discussed in further detail below with respect to FIGS. 4B and 4C, respectively.

Figure 4B:
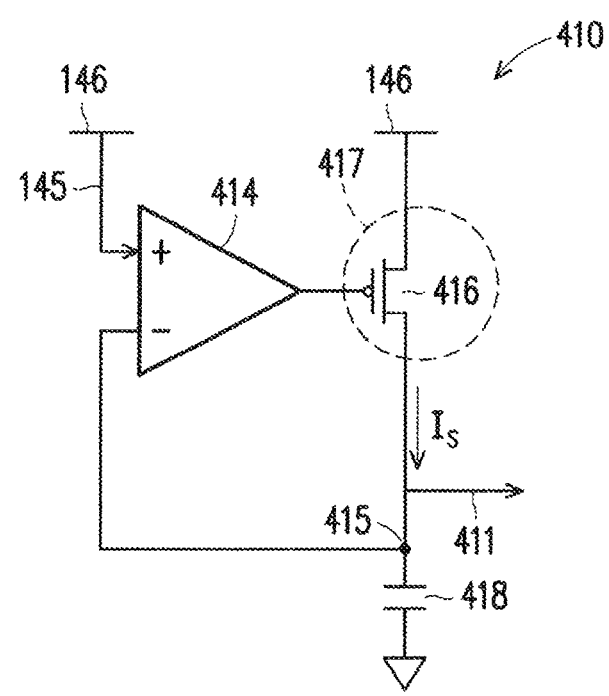
FIG. 4B illustrates an exemplary circuit diagram of a low-dropout (LDO) regulator of the designated PLL circuit of FIG. 4A, in accordance with some embodiments.

FIG. 4B illustrates an exemplary circuit diagram of the LDO regulator 410 in accordance with various embodiments. It is noted that the illustrated embodiment of FIG. 4B is merely a simplified circuit diagram provided for explanation. That is, the LDO regulator 410 can be implemented as any of a variety of circuit diagrams of an LDO regulator to include other circuit elements and/or circuits, for example, a voltage divider, a Miller compensation circuit, one or more switches, etc., while remaining within the scope of the present disclosure.

In some embodiments, the LDO regulator 410 includes an error amplifier 414, a transistor 416, and a capacitor 418. The error amplifier 414 includes first and second input terminals (e.g., a non-inverting input terminal and an inverting input terminal) that are coupled to the global power bus 146 and an output node 415 that is coupled to the ACM 412, respectively. The non-inverting input terminal of the error amplifier 414 is configured to receive the global supplied voltage ($V_{DDG}$) 145 as a to-be regulated input signal, and a voltage signal at the output node 415 is configured to be the regulated voltage 411. An output terminal of the error amplifier 414 is coupled to a standby current source 417 that is formed by the transistor 416. In some embodiments, the standby current source 417 is implemented by a PMOS transistor (e.g., 416). However, it is understood that the standby current source 417 may be implemented as any of a variety of transistors and/or circuits while remaining within the scope of the present disclosure. Further to the embodiment that the standby current source 417 is implemented by the PMOS transistor 416, a gate of the PMOS transistor 416 is coupled to the output terminal of the error amplifier 414, a source of the PMOS transistor 416 is coupled to a first supply voltage (e.g. $V_{DDG}$), and a drain of the PMOS transistor 416 is coupled to the output node 415.

Since the illustrated embodiment of the LDO regulator 410 in FIG. 4B is merely a simplified example, operation of the LDO regulator 410 is briefly described as follows. To operate the LDO regulator 410, in some embodiments, a standby current $I_s$ is generated by the standby current source 417. The standby current $I_s$ charges the capacitor 418 to establish the regulated voltage 411 at the output node 415. The regulated voltage 415 is controlled based on the input voltage 145 received at the non-inverting input terminal of the error amplifier 414. More specifically, when a voltage level of the regulated voltage 415 is relatively high, an error voltage (i.e., the output of the error amplifier 414) received by the gate of the PMOS transistor 416 proportionally increases. The increase in the error voltage reduces source-gate voltage ($V_{sg}$) of the PMOS transistor 416, which causes a decrease in the standby current $I_s$. As a result, the voltage level of the regulated voltage 411 decreases. Through an opposite mechanism, a relatively low output voltage level pulls down the error voltage, then increases the standby current $I_s$, and in turn increases the voltage level of the regulated voltage 411. In other words, the LDO regulator 410 is configured to control the voltage level of the regulated voltage 411 to be at a substantially stable value even though the global supplied voltage ($V_{DDG}$) 145 includes power supply noise.

Figure 4C:
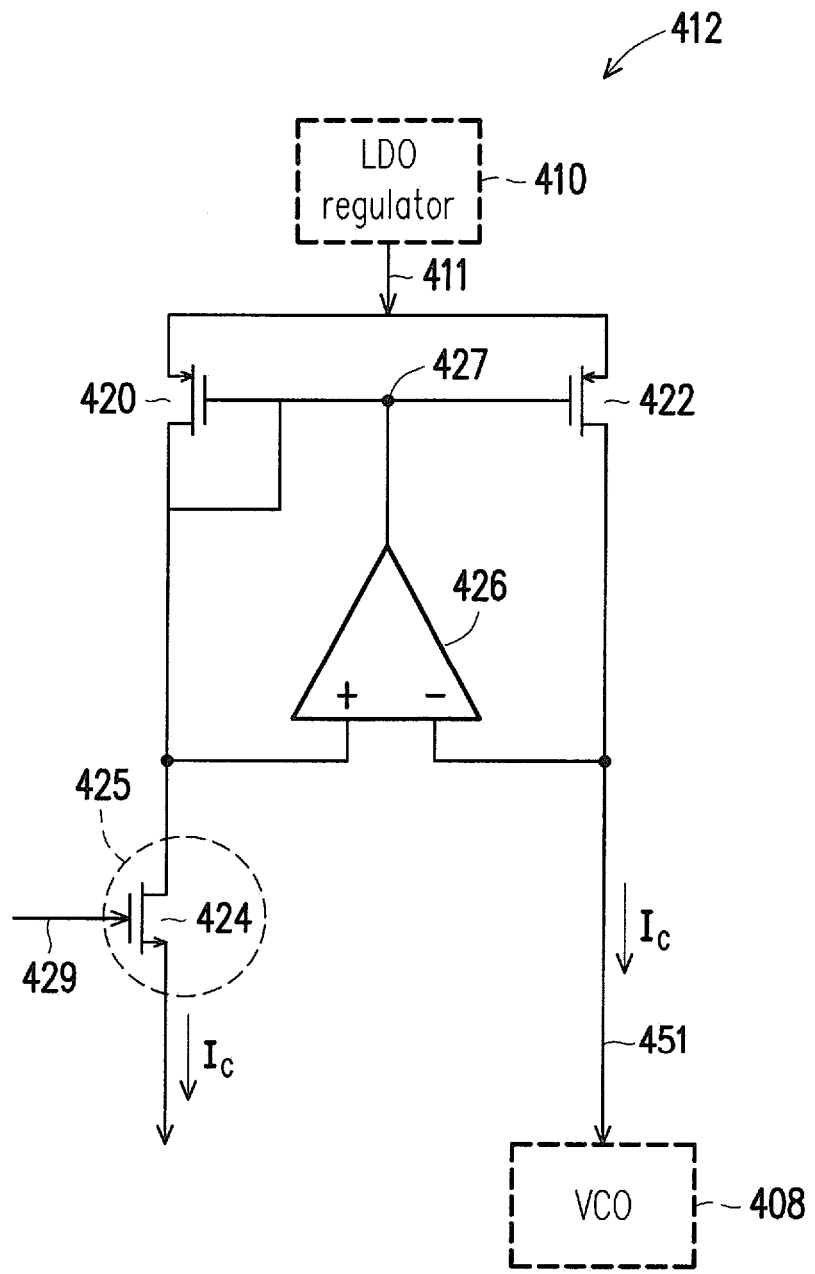
FIG. 4C illustrates an exemplary circuit diagram of an active current mirror (ACM) of the designated PLL circuit of FIG. 4A, in accordance with some embodiments.

FIG. 4C illustrates an exemplary circuit diagram of the ACM 412 coupled between the LDO regulator 410 and the VCO 408, in accordance with various embodiments. It is noted that the illustrated embodiment of FIG. 4C is merely a simplified circuit diagram provided for explanation. That is, the ACM 412 can be implemented as any of a variety of circuit diagrams of an ACM or a current mirror to include other circuit elements and/or circuits, for example, a delay circuit, one or more switches, etc., while remaining within the scope of the present disclosure.

The ACM 412 includes transistors 420, 422, and 424, and an amplifier 426. In some embodiments, the transistors 420 and 422 may be each implemented by a PMOS transistor and the transistor 424 may be implemented by an NMOS transistor. It is noted that the transistors 420 to 424 may be each implemented by any of various types of transistors (e.g., a bipolar junction transistor (BJT), a high-electron mobility transistor (HEMT), etc.) while remaining within the scope of the present disclosure.

More specifically in the illustrated embodiment of FIG. 4C, sources of the PMOS transistors 420 and 422 are coupled to the output node 415 of the LDO regulator 410 (FIG. 4B); gate and drain of the PMOS transistor 420, and a gate of the PMOS transistor 422 are tied together at node 427, which is also coupled to an output terminal of the amplifier 426; first and second input terminals (e.g., a non-inverting input terminal and an inverting input terminal) of the amplifier 426 are coupled to the drains of the PMOS transistors 420 and 422, respectively; a drain of the NMOS transistor 424 is coupled to the drain of the PMOS transistor 420; a gate of the NMOS transistor is configured to receive a control signal 429; and a source of the NMOS transistor 424 is coupled to ground.

Since the illustrated embodiment of the ACM 412 in FIG. 4C is merely a simplified example, operation of the ACM 412 is briefly described as follows. To operate the ACM 412, some embodiments, the NMOS transistor 424 is gated by the control signal 429 so as to serve as a current source 425. Such a current source 425 may provide a current $I_c$. Once the current Ic is generated, the PMOS transistors 420 and 422 that are biased by the regulated voltage 411 may collectively serve as a current mirror. That is, the current $I_c$ is mirrored from the PMOS transistor 420 to the PMOS transistor 422. Since the gates and drains of the PMOS transistors 420 and 422 are tied to the output terminal (at the node 427) and input terminals (the non-inverting and inverting input terminals) of the amplifier 426, respectively, the mirrored current $I_c$ (i.e., the current flowing through the PMOS transistor 422) is well controlled. For example, even though the regulated voltage 411 includes a fluctuation (e.g., power supply noise), the mirrored current $I_c$ can be maintained at a substantially stable value. As such, the voltage 451 that is provided to the VCO 408 as the supplied voltage may be substantially stable.

Figure 4D:
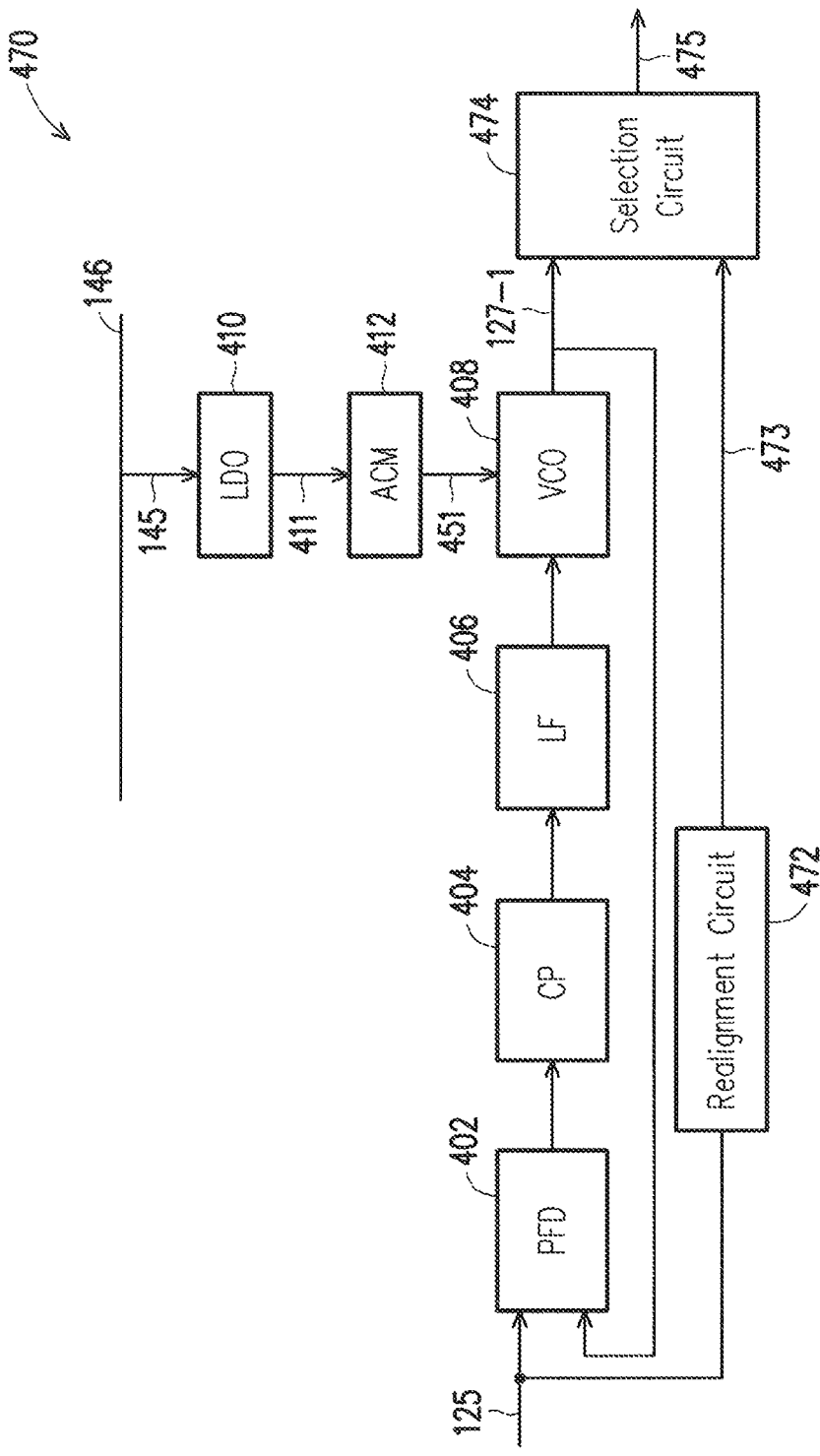
FIG. 4D illustrates another exemplary circuit diagram of the designated PLL circuit of the PLL architecture of FIG. 1 that includes a realignment feature, in accordance with some embodiments.

FIG. 4D illustrates another exemplary block diagram of the designated PLL circuit 126-1, in accordance with some embodiments. Again, since the designated PLL circuits (126-1, 126-2, 126-3, etc.) of the PLL architecture 120 are substantially similar to one another, the following discussion of the designated PLL circuit will use the designated PLL circuit 126-1 as a representative example. Further, for purposes of explanation, the designated PLL circuit shown in FIG. 4D is herein referred to as "designated PLL circuit 470."

In some embodiments, the designated PLL circuit 470 of FIG. 4D is substantially similar to the designated PLL circuit 126-1 of FIG. 4A except that the designated PLL circuit 470 further includes a realignment circuit 472 and a selection circuit 474. Thus, for brevity, discussions of the similar circuit components, i.e., the PFD 402, the CP 404 the LF 406, the VCO 408, the LDO 410, and the ACM 412, are omitted here.

According to some embodiments, the realignment circuit 472 is configured to receive the distributed clock signal 125 concurrently with the PFD 402, and provide a realigned pulse signal 473 based on the distributed clock signal 125 to the selection circuit 474. More specifically, in some embodiments, the realignment circuit 472 may include one or more logic gates. For example, the realignment circuit 472 may include an AND logic gate configured to receive the distributed clock signal 125 and a realignment enable signal (not shown) as inputs, and perform an AND logic function on the distributed clock signal 125 and the realignment enable signal. In some embodiments, such a realignment enable signal may be a pulse signal. Accordingly, in some embodiments, when the AND logic gate receives both the distributed clock signal 125 and the realignment enable signal at a logic high state, the AND logic gate (i.e., the realignment circuit 472) may output the realigned pulse signal 473, which will be discussed in further detail below. The selection circuit 474 is configured to receive the clock signal 127-1 (generated by the VCO 408) and the realigned pulse signal 473, and selectively output a realigned clock signal 475 to the sub-system circuit 140-1 based on the realigned pulse signal 473. Such a realignment feature provides various advantages. For example, every time the realigned clock signal 475 is realigned according to the realigned pulse signal 473, at least part of jitter noise in the clock signal 127-1 that is accumulated through the PFD 402, the CP 404, and the LF 406 may be cleared out. Accordingly, the realigned clock signal 475 may have minimum jitter noise. Operations of the realignment circuit 472 and the selection circuit 474 will be discussed in further detail hello with respect to FIG. 4E.

Figure 4E:
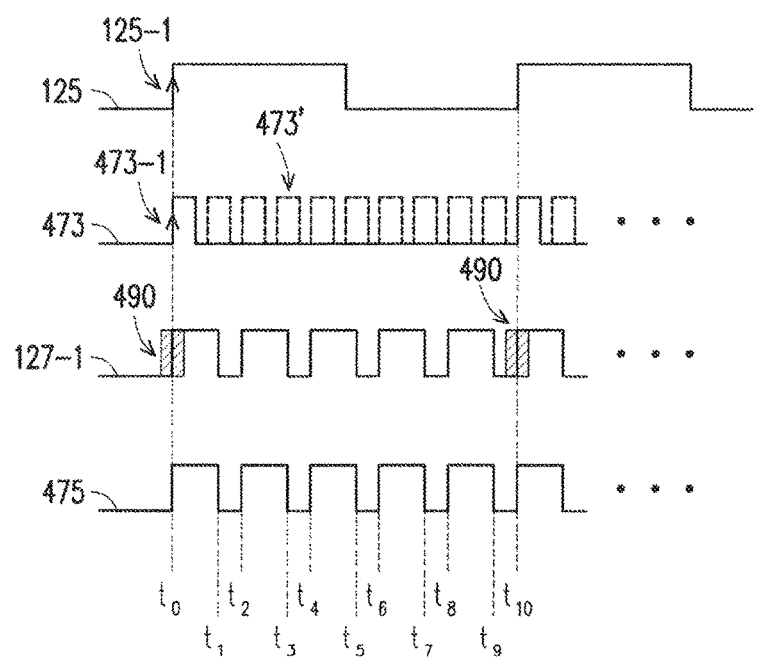
FIG. 4E illustrates exemplary waveforms to operate the designated PLL circuit of FIG. 4D, in accordance with some embodiments.

FIG. 4E illustrates exemplary waveforms of the distributed clock signal 125, the realigned pulse signal 473, the clock signal 127-1, and the realigned clock signal 475 to operate the realignment circuit 472 and the selection circuit 474, in accordance with some embodiments. As shown, each of the distributed clock signal 125, the realigned pulse signal 473, the clock signal 127-1 and the realigned clock signal 475 is a periodic clock signal oscillating between a logical high state and a logical low state over time. To provide the above-mentioned realignment feature, the distributed clock signal 125 is received by the PFD 402 and the realignment circuit 472. In some embodiments, the PFD 402, and serially coupled PLL components (404, 406, 408, 410, and 412) are configured to perform the respective functionalities so as to provide the clock signal 127-1, which is locked at the desired frequency $f_1$. Concurrently or subsequently, for example, at time t0, the realignment circuit 472 generates the realigned pulse signal 473 that includes a rising edge 473-1 aligned with a rising edge 125-1 of the distributed clock signal 125. In some embodiments, the realignment circuit 472 may first generate a pulse signal 473' (shown in dotted lines), and determine how many pulses are to be aligned based on the frequency of the distributed clock signal 125. In the illustrated example of FIG. 4E, the realignment circuit 472 may generate the pulse signal 473' including 10 pulses within a cycle (from time t0 to time t10), and only use one of the pulses to be aligned with the rising edge 125-1 of the distributed signal 125.

Once the clock signal 127-1 and the realigned pulse signal 473 are received by the selection circuit 474, based on a logical state of realigned pulse signal 473, the selection circuit 474 determines whether to use the realigned pulse signal 473 to justify the clock signal 127-1. More specifically, when the logical state of the realigned pulse signal 473 is at low (e.g., from time t1 to time t9), the selection circuit 474 may output the clock signal 127-1 as the realigned clock signal 475; when the logical state of the realigned pulse signal 473 is at high (e.g., at time t0), the selection circuit 474 may output the clock signal 127-1 by using the rising edge 473-1 of the realigned pulse signal 473 to realign a rising edge of the clock signal 127-1 at time t0. It is noted in the illustrated example of FIG. 4E that the rising edge of the clock signal 127-1 at time t0 (also at time t10) has some jitter noise 490, which may be due to various noise sources originated from each of the PLL components, e.g., 402, 404, 406, 408, etc. Thus, by using the realignment circuit 472 and the selection circuit 474 to generate the realigned clock signal 475, the jitter noise (e.g., 490) may be advantageously eliminated.

Figure 5:
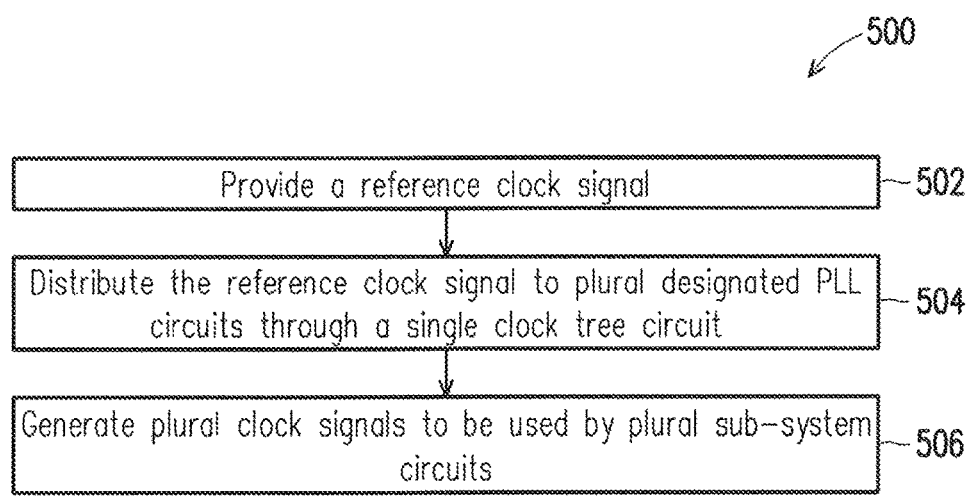
FIG. 5 illustrates an exemplary flow chart of a method to operate the PLL architecture of FIG. 1, in accordance with some embodiments.

FIG. 5 illustrates a flow chart of a method 500 to provide plural clock signals (e.g., 127-1, 127-2, 127-3, etc.) to respective sub-system circuits (e.g., 140-1, 140-2, 140-3, etc.) of an SoC circuit (e.g., 100) through a single clock tree circuit (e.g., 124), in accordance with various embodiments. In various embodiments, the operations of the method 500 are performed by the respective components illustrated in FIGS. 1-4D. For purposes of discussion, the following embodiment of the method 500 will be described in conjunction with FIGS. 1-4E. The illustrated embodiment of the method 500 is merely an example. Therefore, it should be understood that any of a variety of operations may be omitted, re-sequenced, and/or added while remaining within the scope of the present disclosure.

The method 500 starts with operation 502 in which a reference clock signal is provided by a reference PLL circuit of a PLL architecture of an SoC circuit, in accordance with various embodiments. In the example illustrated in FIG. 1, the reference clock signal 123 is provided by the reference PLL circuit 122 of the PLL architecture 120. In some embodiments, the PLL architecture 120 is part of the SoC circuit 100. More specifically, the PLL architecture 120 is made on the same chip 150 with plural sub-system circuits (140-1, 140-2, 140-3, etc.) of the SoC circuit 100.

The method 500 continues to operation 504 in which the reference clock signal is distributed to plural designated PLL circuits of the PLL architecture through a single clock tree circuit, in accordance with various embodiments. Continuing with the above example, the clock tree circuit 124 is configured to distribute the reference clock signal 123 as the distributed clock signal 125 to each of the designated PLL circuits (e.g., 126-1, 126-2, 126-3, etc.). In some embodiments, the distributed clock signal 125 is substantially similar to the reference clock signal 123, e.g., sharing the same frequency (fret).

The method 500 continues to operation 506 in which plural clock signals are generated and provided to respective sub-system circuits of the SoC circuit, in accordance with various embodiments. Upon receiving the distributed clock signal 125, each designated PLL circuit uses respective circuit components (e.g., 402, 404, 406, 408, 410, 412, 472, 474, etc.) to generate a respective clock signal (127-1, 127-2, 127-3, etc.) to be provided to the corresponding sub-system circuit (140-1, 140-2, 140-3, etc.). In some embodiments, each of the clock signals (127-1, 127-2, 127-3, etc.) may have a respective different frequency.

In an embodiment, a phase-lock-loop (PLL) circuit includes a reference PLL circuit configured to generate a reference clock signal, a single clock tree circuit, coupled to the reference PLL circuit, and configured to distribute the reference clock signal; and a plurality of designated PLL circuits coupled to the clock tree circuit, wherein the designated PLL circuits are each configured to receive the distributed reference clock signal through the single clock tree circuit and provide a respective clock signal based on the reference clock signal.

In another embodiment, a system circuit includes a plurality of sub-system circuits, and a phase-lock-loop (PLL) architecture. The PLL architecture, coupled to the plurality of sub system circuits, includes a reference PLL circuit configured to generate a reference clock signal; a single clock tree circuit, coupled to the reference PLL circuit, and configured to distribute the reference clock signal; and a plurality of designated PLL circuits coupled to the clock tree circuit, wherein the designated PLL circuits are each configured to receive the distributed reference clock signal through the single clock tree circuit and provide a respective clock signal based on the distributed reference clock signal to a corresponding sub-system circuit.

Yet in another embodiment, a method includes generating a reference clock signal by a reference phase-lock-loop (PLL) circuit; distributing the reference clock signal to a plurality of designated PLL circuits through a single clock tree circuit; and using the distributed reference clock signal, by the plurality of designated PLL circuits, to provide a plurality of clock signals that each has a respective different frequency.

The foregoing outlines features of several embodiments so that those ordinarily skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-lock-loop (PLL) circuit, comprising:
a reference PLL circuit configured to generate a reference clock signal;
a single clock tree circuit comprising a first buffer having an input coupled to the reference PLL circuit and configured to receive the reference clock signal and a plurality of second buffers each having an input coupled to an output of the first buffer, wherein each of the plurality of second buffers has an output configured to output a distributed reference clock signal based on the reference clock signal; and
a plurality of designated PLL circuits each coupled to a respective one of the outputs of the second buffers, wherein the designated PLL circuits are each configured to receive a respective distributed reference clock signal through a respective second buffer and provide a respective clock signal based on the reference clock signal, wherein each designated PLL circuit comprises: a phase frequency detector (PFD), a charge pump (CP), a low-pass filter (LF), a voltage controlled oscillator (VCO), a low-dropout (LDO) regulator and an active current mirror (ACM) coupled to the VCO, wherein the ACM comprises a first transistor and a second transistor, wherein the first transistor and the second transistor are configured to receive in parallel a regulated voltage produced by the LDO regulator, wherein a gate of the first transistor is coupled to a gate of the second transistor and an amplifier, and wherein the LDO regulator is coupled to a power bus and the ACM is coupled between the LDO regulator and the VCO.

2. The circuit of claim 1, wherein each of the respective clock signals has a respective frequency.

3. The circuit of claim 1, wherein the reference PLL circuit includes a reference phase frequency detector (PFD), a reference charge pump (CP), a reference low-pass filter (LF), and a reference voltage controlled oscillator (VCO).

4. The circuit of claim 3, wherein the reference VCO includes either a ring oscillator or an inductor-capacitor (LC) tank oscillator.

5. The circuit of claim 1, wherein each distributed reference clock signal has a same frequency as the reference clock signal.

6. The circuit of claim 1, wherein the LDO regulator and the ACM are collectively configured to provide a stable supplied voltage to the respective VCO by regulating a global supply voltage.

7. The circuit of claim 1, wherein each designated PLL circuit further includes a realignment circuit and a selection circuit.

8. The circuit of claim 7, wherein the realignment circuit is configured to provide a realigned pulse signal to the selection circuit based on the reference clock signal, and the selection circuit is configured to selectively use the realigned pulse signal to realign a rising edge of the respective clock signal.

9. A system circuit, comprising:
a plurality of sub-system circuits; and
a phase-lock-loop (PLL) architecture, coupled to the plurality of sub-system circuits, comprising:
a reference PLL circuit configured to generate a reference clock signal;
a single clock tree circuit comprising a first buffer having an input coupled to the reference PLL circuit and configured to receive the reference clock signal and a plurality of second buffers each having an input coupled to an output of the first buffer, wherein each of the plurality of second buffers has an output configured to output a distributed reference clock signal based on the reference clock signal; and
a plurality of designated PLL circuits each coupled to a respective one of the outputs of the second buffers, wherein the designated PLL circuits are each configured to receive a respective distributed reference clock signal through a respective second buffer and provide a respective clock signal based on the reference clock signal to a corresponding sub-system circuit, wherein each designated PLL circuit comprises: a phase frequency detector (PFD), a charge pump (CP), a low-pass filter (LF), a voltage controlled oscillator (VCO), a low-dropout (LDO) regulator and an active current mirror (ACM) coupled to the VCO, wherein the ACM comprises a first transistor and a second transistor, wherein the first transistor and the second transistor are configured to receive in parallel a regulated voltage produced by the LDO regulator, wherein a gate of the first transistor is coupled to a gate of the second transistor and an amplifier, and wherein the LDO regulator is coupled to a power bus and the ACM is coupled between the LDO regulator and the VCO.

10. The circuit of claim 9, wherein each of the respective clock signals has a respective frequency.

11. The circuit of claim 9, wherein the reference PLL circuit includes a reference phase frequency detector (PFD), a reference charge pump (CP), a reference low-pass filter (LF), and a reference voltage controlled oscillator (VCO).

12. The circuit of claim 9, wherein the plurality of sub-system circuits and the PLL architecture are fabricated on a same chip.

13. The circuit of claim 9, wherein the plurality of sub-system circuits and the PLL architecture are coupled to a global power supply bus so as to receive a global supply voltage.

14. The circuit of claim 9, wherein each designated PLL circuit further includes a realignment circuit and a selection circuit, and wherein the realignment circuit is configured to provide a realigned pulse signal to the selection circuit based on the reference clock signal, and the selection circuit is configured to selectively use the realigned pulse signal to realign a rising edge of the respective clock signal.

15. A method, comprising:
generating a reference clock signal by a reference phase-lock-loop (PLL) circuit;
providing the reference clock signal to an input of a first buffer;
providing an output of the first buffer to respective inputs of a plurality of second buffers;
providing respective outputs of the plurality of second buffers to a plurality of designated PLL circuits, respectively, thereby distributing the reference clock signal to the plurality of designated PLL circuits through a single clock tree circuit, wherein the single clock tree circuit comprises the first buffer and the plurality of second buffers; and using the distributed reference clock signal, by the plurality of designated PLL circuits, to provide a plurality of clock signals that each has a respective different frequency, wherein each designated PLL circuit comprises: a phase frequency detector (PFD), a charge pump (CP), a low-pass filter (LF), a voltage controlled oscillator (VCO), a low-dropout (LDO) regulator and an active current mirror (ACM) coupled to the VCO, wherein the ACM comprises a first transistor and a second transistor, wherein the first transistor and the second transistor are configured to receive in parallel a regulated voltage produced by the LDO regulator, wherein a gate of the first transistor is coupled to a gate of the second transistor and an amplifier, and wherein the LDO regulator is coupled to a power bus and the ACM is coupled between the LDO regulator and the VCO.

16. The method of claim 15 further comprising providing respective outputs of each of the plurality of designated PLL circuits to a plurality of sub-system circuits.

17. The method of claim 16 wherein the reference PLL, the first buffer, the plurality of second buffers, the plurality of designated PLLs and the plurality of sub-system circuits are fabricated on a single chip.

18. The method of claim 16, wherein the plurality of sub-system circuits and the PLL architecture are coupled to a global power supply bus so as to receive a global supply voltage.

19. The method of claim 15, further comprising providing a realignment circuit and a selection circuit for each designated PLL circuit, wherein the realignment circuit is configured to provide a realigned pulse signal to the selection circuit based on the reference clock signal, and the selection circuit is configured to selectively use the realigned pulse signal to realign a rising edge of the respective clock signal.

* * * * *